(12) United States Patent
Chew et al.

(10) Patent No.: US 10,593,765 B2
(45) Date of Patent: Mar. 17, 2020

(54) METHOD FOR FORMING SOURCE/DRAIN CONTACTS

(71) Applicant: IMEC VZW, Leuven (BE)

(72) Inventors: Soon Aik Chew, Heverlee (BE); Steven Demuynck, Aarschot (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/170,674

(22) Filed: Oct. 25, 2018

(65) Prior Publication Data
US 2019/0131411 A1 May 2, 2019

(30) Foreign Application Priority Data
Nov. 2, 2017 (EP) ..................... 17199711

(51) Int. Cl.
*H01L 29/51* (2006.01)
*H01L 29/40* (2006.01)
*H01L 21/311* (2006.01)
*H01L 21/3105* (2006.01)
*H01L 29/66* (2006.01)
*H01L 29/417* (2006.01)
*H01L 21/768* (2006.01)

(52) U.S. Cl.
CPC ...... *H01L 29/401* (2013.01); *H01L 21/31053* (2013.01); *H01L 21/31111* (2013.01); *H01L 21/31116* (2013.01); *H01L 21/31144* (2013.01); *H01L 21/76897* (2013.01); *H01L 29/41791* (2013.01); *H01L 29/513* (2013.01); *H01L 29/66795* (2013.01)

(58) Field of Classification Search
CPC .......... H01L 29/401; H01L 29/513; H01L 29/66795; H01L 29/41791
See application file for complete search history.

(56) References Cited

U.S. PATENT DOCUMENTS 6,010,935 A 1/2000 Doan
8,637,358 B1 1/2014 Koburger, III et al.
(Continued)

FOREIGN PATENT DOCUMENTS

EP 3171409 A1 5/2017

OTHER PUBLICATIONS

European Search Report, European Patent Application No. 17199711.7, dated May 22, 2018, 10 pages.

*Primary Examiner* — Douglas M Menz
(74) *Attorney, Agent, or Firm* — McDonnell Boehnen Hulbert & Berghoff LLP

(57) ABSTRACT

Example embodiments relate to methods for forming source/drain contacts. One embodiment includes a method for forming a source contact and a drain contact in a semiconductor structure. The method includes providing a semiconductor structure that includes a semiconductor active area having channel, source, and drain regions, a gate structure on the channel region, a gate plug on the gate structure, spacers lining side walls of the gate structure and of the gate plug, an etch stop layer covering the source and gain regions, a sacrificial material on the etch stop layer over the source and drain regions, and a masking structure that masks the source and drain regions. The method also includes forming gaps, removing the masking structure, filling the gaps, exposing the sacrificial material, removing the sacrificial material, removing the etch stop layer, and forming the source contact and the drain contact by depositing a conductive material.

20 Claims, 9 Drawing Sheets

(56) References Cited

U.S. PATENT DOCUMENTS

| | | |
|---|---|---|
| 9,112,031 B2 | 8/2015 | Leobandung |
| 9,257,529 B2 | 2/2016 | Metz |
| 9,318,581 B1 | 4/2016 | Guo et al. |
| 9,502,286 B2 | 11/2016 | Xie et al. |
| 9,685,374 B1 | 6/2017 | Lin et al. |
| 2011/0147840 A1 | 6/2011 | Cea et al. |
| 2014/0159159 A1 | 6/2014 | Steigerwald et al. |
| 2015/0235897 A1 | 8/2015 | Fu et al. |
| 2015/0340467 A1 | 11/2015 | Bouche et al. |
| 2016/0148936 A1 | 5/2016 | Xu et al. |
| 2016/0233298 A1 | 8/2016 | Webb et al. |
| 2016/0293485 A1 | 10/2016 | Song et al. |
| 2017/0054003 A1 | 2/2017 | Liao et al. |

METHOD FOR FORMING SOURCE/DRAIN CONTACTS

CROSS-REFERENCE TO RELATED APPLICATIONS

The present application is a non-provisional patent application claiming priority to European Patent Application No. EP 17199711.7, filed Nov. 2, 2017, the contents of which are hereby incorporated by reference.

FIELD OF THE DISCLOSURE

The present disclosure relates to the formation of semiconductor structures and in particular to the formation of source contacts and/or drain contacts in such semiconductor structures.

BACKGROUND

In the fabrication of semiconductor devices, source/drain contacts need to be formed which connect to their corresponding source/drain regions. The methods for forming self-aligned contacts that have been used up to now are facing a major challenge from the 10 nm node downwards. The high aspect ratio etching (e.g. 15:1 or larger) that is used to form the contacts, while maintaining a high etch selectivity (typically with respect to SiCO or SiN), appears to be at least impractical to achieve. As such, issues of underetching and/or overetching can easily happen within a die.

Furthermore, as technology scales down to the 10 nm node and lower, the issue of maximizing the contact area to a source/drain region, thereby keeping the contact and fin resistance within acceptable limits, becomes increasingly relevant. As such, wrap-around contacts appear to be the promising contact scheme to replace the diamond-shaped source/drain regions that are typically used up to now. However, the post-etch cleaning of the source/drain regions, e.g. epitaxially grown Si:P and SiGe:B, in complementary metal oxide semiconductor (CMOS) technology is challenging in practice.

U.S. Pat. No. 9,685,374B1 describes a method for making a semiconductor structure, comprising forming wrap-around contacts. However, the remote plasma etch used therein is difficult to control. Furthermore, the contact etch stop layer (CESL) is exposed twice to a selective etch, as such the CESL will need to be relatively thick (>5 nm). Both these issues make that this method is not well suited for small contacts; for example the 10 nm node, but more particularly the 7 nm node, where the contact critical dimension may typically be around 14 to 16 nm.

There is thus still a need in the art for better ways to form source/drain contacts in semiconductor structures.

SUMMARY

Various embodiments may provide methods for forming source contacts and/or drain contacts in semiconductor structures. Some embodiments provide intermediate structures, obtainable in the course of performing the methods.

In some embodiments, source/drain contacts can be formed even for small technology nodes (e.g. 10 nm node or 7 nm node).

In some embodiments, the source/drain contacts may be self-aligned.

In some embodiments, source/drain regions to which the contacts are to be formed may be well exposed (e.g. low underetching of a material covering the source/drain regions). In some embodiments, the source/drain contacts may be formed with minimal damage to the source/drain regions (e.g. low overetching of the source/drain regions).

In some embodiments, the source/drain contacts may be wrap-around contacts.

In some embodiments, an etching performed during the method, e.g. to form gaps for the source/drain contacts and to expose the source/drain regions, can have a high etch selectivity. In some embodiments, the etching can be performed to form gaps having a high aspect ratio (e.g. 15:1).

In some embodiments, the etch stop layer covering the source/drain region may be exposed to only a single selective removal step, allowing it to be relatively thin.

In a first aspect, the present disclosure relates to a method for forming a source contact and a drain contact in a semiconductor structure, comprising:
  masking a source region and a drain region,
  replacing an unmasked sacrificial material with a dielectric layer,
  removing the masking structure,
  selectively removing, by a wet etching, the sacrificial material above the source and/or drain region with respect to the dielectric layer, to such an extent as to expose the top surface of the source and/or drain region, and
  depositing a conductive material on the source and/or drain region, thereby forming the source contact and/or drain contact in the semiconductor structure.

Expressed differently, the present disclosure relates to a method for forming a source contact and/or a drain contact in a semiconductor structure, comprising:
  a. providing a semiconductor structure comprising:
    i. a semiconductor active area comprising a channel region, a source region and a drain region, the source and drain regions having a top surface;
    ii. a gate structure on the channel region, the gate structure having a top surface and side walls;
    iii. a gate plug on the top surface of the gate structure, the gate plug having side walls;
    iv. spacers lining the side walls of the gate structure and of the gate plug;
    v. an etch stop layer covering the top surface of the source and drain regions;
    vi. a sacrificial material on the etch stop layer over the source and drain regions, and on other parts of the semiconductor structure;
    vii. a masking structure masking the source region and the drain region while leaving the other parts of the semiconductor structure unmasked;
  b. selectively removing the sacrificial material present on the other parts of the semiconductor structure, thereby forming gaps;
  c. optionally removing all or part of the masking structure;
  d. depositing a dielectric layer on the semiconductor structure, thereby filling the gaps;
  e. exposing the sacrificial material present on the etch stop layer over the source region and the drain region;
  f. selectively removing the sacrificial material present on the etch stop layer over the source region and the drain region;
  g. selectively removing the etch stop layer covering at least the top surface of the source region and the drain region to such an extent as to expose the top surface of the source region and the drain region;

h. depositing a conductive material on the source region and the drain region, thereby forming the source contact and the drain contact in the semiconductor structure;

wherein step f is performed by a wet etching process;
wherein step g is performed by a wet etching process; and
wherein the material of the gate plug, the material of the spacers, the sacrificial material, the material of the etch stop layer, the material of the dielectric layer, and the material of the source and drain regions are selected in such a way:
 that the sacrificial material etches faster than the material of the gate plug, the material of the spacers, the material of the etch stop layer, and the material of the dielectric layer during the wet etching process of step f;
 that the etch stop layer can be entirely removed without entirely removing the gate plug, and
 that the material of the etch stop layer etches faster than the material of the material of the spacers, the material of the dielectric layer, and the material of the source and drain regions during the wet etching process of step g.

The etch stop layer and the gate plug can be made of the same material or of different materials. If they are made of the same material, the etch stop layer can be entirely removed without entirely removing the gate plug because the thickness of the etch stop layer is typically smaller than the thickness of the gate plug. If they are made of different materials, this constraint on the difference in thickness between the etch stop layer and the gate plug does not necessarily exist but the thickness of the etch stop layer will nevertheless typically be smaller than the thickness of the gate plug.

In embodiments, the present disclosure relates to a method for forming a source contact and/or a drain contact in a semiconductor structure, comprising:
a. providing a semiconductor structure comprising:
  i. a semiconductor active area comprising a channel region, a source region and a drain region, the source and drain regions having a top surface;
  ii. a gate structure on the channel region, the gate structure having a top surface and side walls;
  iii. a gate plug on the top surface of the gate structure, the gate plug having side walls;
  iv. spacers lining the side walls of the gate structure and of the gate plug;
  v. an etch stop layer covering the top surface of the source and drain regions;
  vi. a sacrificial material on the etch stop layer over the source and drain regions, and on other parts of the semiconductor structure;
  vii. a masking structure masking the source region and the drain region while leaving the other parts of the semiconductor structure unmasked;
b. selectively removing the sacrificial material present on the other parts of the semiconductor structure, thereby forming gaps;
c. optionally removing all or part of the masking structure;
d. depositing a dielectric layer on the semiconductor structure, thereby filling the gaps;
e. exposing the sacrificial material present on the etch stop layer over the source region and the drain region;
f. selectively removing the sacrificial material present on the etch stop layer over the source region and the drain region;
g. selectively removing the etch stop layer covering at least the top surface of the source region and the drain region to such an extent as to expose the top surface of the source region and the drain region;
h. depositing a conductive material on the source region and the drain region, thereby forming the source contact and the drain contact in the semiconductor structure;

wherein step f is performed by a wet etching process;
wherein step g is performed by a wet etching process; and
wherein the material of the gate plug, the material of the spacers, the sacrificial material, the material of the etch stop layer, the material of the dielectric layer, and the material of the source and drain regions are selected in such a way:
 that the sacrificial material etches faster than the material of the gate plug, the material of the spacers, the material of the etch stop layer, and the material of the dielectric layer during the wet etching process of step f; and
 that the material of the etch stop layer etches faster than the material of the gate plug, the material of the spacers, the material of the dielectric layer, and the material of the source and drain regions during the wet etching process of step g.

In a second aspect, the present disclosure relates to a semiconductor structure, comprising:
 i. a semiconductor active area comprising a channel region, a source region and a drain region, the source and drain regions having a top surface;
 ii. a gate structure on the channel region, the gate structure having a top surface and side walls;
 iii. a gate plug on the top surface of the gate structure, the gate plug having side walls;
 iv. spacers lining the side walls of the gate structure and of the gate plug;
 v. an etch stop layer covering at least the top surface of the source and drain regions;
 vi. a sacrificial material on the etch stop layer over the source and drain regions;
 vii. a dielectric layer covering other parts of the semiconductor structure while leaving the source region and the drain region uncovered;
wherein the material of the gate plug, the material of the spacers, the sacrificial material, the material of the etch stop layer, the material of the dielectric layer, and the material of the source and drain regions are selected in such a way:
 that the sacrificial material can be etched faster than the material of the gate plug, the material of the spacers, the material of the etch stop layer and the material of the dielectric layer during a wet etching process;
 that the etch stop layer can be entirely removed without entirely removing the gate plug, and
 that the material of the etch stop layer can be etched faster than the material of the spacers, the material of the dielectric layer, and the material of the source and drain regions during a wet etching process.

In embodiments, the condition that the etch stop layer can be entirely removed without entirely removing the gate plug can be satisfied by having a thickness for the etch stop layer smaller than a thickness for the gate plug, by having a material for the etch stop layer etching faster than a material for the gate plug, or by a combination of both.

Particular aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts represent substantial improvements, including departures from prior practices, resulting in the provision of more efficient, stable, and reliable devices of this nature.

The above and other characteristics and features will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
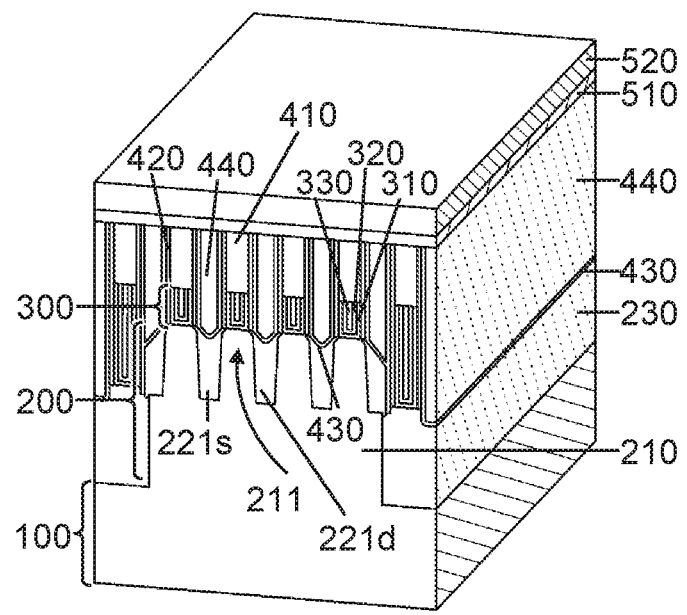
FIG. 1 is a schematic representation of a frontal perspective view of a semiconductor structure at a step of a method, according to example embodiments.

In the different figures, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, over, under and the like in the description and the claims are used for descriptive purposes and not necessarily for describing relative positions. It is to be understood that the terms so used are interchangeable with their antonyms under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent from this disclosure, in one or more embodiments.

Similarly, it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments may be practiced without these specific details. In other instances, well-known methods, structures and techniques have not been shown in detail in order not to obscure an understanding of this description.

Reference will be made to transistors. These are devices having a first main electrode such as a drain, a second main electrode such as a source and a control electrode such as a gate for controlling the flow of electrical charges between the first and second main electrodes.

It is understood that example embodiments are also applicable to similar devices that can be configured in any transistor technology, including for example, but not limited thereto, CMOS, BiCMOS, Bipolar and SiGe BiCMOS technology.

The following terms are provided solely to aid in understanding.

As used herein, and unless otherwise specified, under "source/drain" is understood a "source and/or drain". Likewise, under "source/drain entity", e.g. source/drain region, is understood a "source entity and/or drain entity", e.g. a source region and/or drain region. In embodiments, a source and a drain may be comparable (e.g. indistinguishable) and their designation may depend on a relative voltage difference that is put across them in the final semiconductor device.

As used herein, and unless otherwise specified, when a first material is described as being removed or etched selectively with respect to a second material, this means that the first material is removed or etched faster than the second material. In some embodiments, the removal or etching process would remove or etch the first material at least twice faster, e.g., at least five times faster, such as at least ten times faster, than the second material. In some embodiments, the second material may be substantially not removed or etched by the removal or etching process.

In a first aspect, the present disclosure relates to a method for forming a source contact and/or a drain contact in a semiconductor structure, comprising:
 a. providing a semiconductor structure comprising:
  i. a semiconductor active area comprising a channel region, a source region and a drain region, the source and drain regions having a top surface;
  ii. a gate structure on the channel region, the gate structure having a top surface and side walls;
  iii. a gate plug on the top surface of the gate structure, the gate plug having side walls;
  iv. spacers lining the side walls of the gate structure and of the gate plug;
  v. an etch stop layer covering the top surface of the source and drain regions;
  vi. a sacrificial material on the etch stop layer over the source and drain regions, and on other parts of the semiconductor structure;
  vii. a masking structure masking the source region and the drain region while leaving the other parts of the semiconductor structure unmasked;
 b. selectively removing the sacrificial material present on the other parts of the semiconductor structure, thereby forming gaps;
 c. optionally removing all or part of the masking structure;
 d. depositing a dielectric layer on the semiconductor structure, thereby filling the gaps;
 e. exposing the sacrificial material present on the etch stop layer over the source region and the drain region;
 f. selectively removing the sacrificial material present on the etch stop layer over the source region and the drain region;
 g. selectively removing the etch stop layer covering at least the top surface of the source region and the drain region to such an extent as to expose the top surface of the source region and the drain region;
 h. depositing a conductive material on the source region and the drain region, thereby forming the source contact and the drain contact in the semiconductor structure;
wherein step f is performed by a wet etching process;
wherein step g is performed by a wet etching process; and
wherein the material of the gate plug, the material of the spacers, the sacrificial material, the material of the etch stop layer, the material of the dielectric layer, and the material of the source and drain regions are selected in such a way:
 that the sacrificial material etches faster than the material of the gate plug, the material of the spacers, the material of the etch stop layer, and the material of the dielectric layer during the wet etching process of step f; and
 that the etch stop layer can be entirely removed without entirely removing the gate plug, and
 that the material of the etch stop layer etches faster than the material of the spacers, the material of the dielectric layer, and the material of the source and drain regions during the wet etching process of step g.

The semiconductor structure may typically also be referred to as a semiconductor device. The semiconductor structure may, for example, be a semiconductor circuit comprising one or more transistors, such as a complementary metal oxide semiconductor (CMOS) structure. The transistor may, for example, be a fin field effect transistor (FinFET).

In embodiments, the semiconductor active area (e.g. a channel region and/or a source/drain region) may comprise a material selected from Si, SiGe, and Ge. In embodiments, a first source/drain region (e.g. a source region) and a second source/drain region (e.g. a drain region) may define the channel region therebetween. In embodiments, the semiconductor active area may comprise a semiconductor fin. In embodiments, the semiconductor fin may comprise the channel region. In embodiments, the semiconductor fin may comprise a material selected from Si, SiGe, and Ge. In embodiments, a dielectric material may be present between two semiconductor fins. In embodiments, the dielectric material may be $SiO_2$. The dielectric material (e.g. a shallow trench isolation layer) may provide an electrical isolation between two semiconductor fins. In embodiments, the source/drain regions may be epitaxially grown and may optionally be doped. In embodiments, the source/drain regions may comprise Si:P or SiGe:B.

In embodiments, the gate structure may comprise a gate dielectric, a work function metal and a gate contact. In embodiments, the gate structure may define the channel region in the semiconductor active area it overlaps. In embodiments, the gate dielectric may be a high-k material (e.g. $HfO_2$). In embodiments, the work function metal may be a work function adjustment metal. In embodiments, the work function metal may be selected from TiN, TaN, TiSiN, TiAl, and TiC. In some embodiments, the gate contact may comprise W.

In embodiments, the gate plug may comprise a nitride material (e.g. SiN) or an oxycarbide material (e.g. SiCO). In embodiments, the gate plug may be provided using a chemical vapor deposition (CVD) or an atomic layer deposition (ALD). In some embodiments, the thickness of the gate plug may be from 20 to 50 nm, e.g., from 30 to 40 nm. For instance, it can be 35 nm.

In embodiments, the spacers may comprise a low-k material (e.g. SiBCN or SiCO). In the final device, the spacers may provide an electrical isolation between a gate contact on the one hand and a source/drain contact on the other hand.

In embodiments, the etch stop layer may comprise a nitride material (e.g. SiN). In embodiments, the spacers may have side walls and the etch stop layer may further cover the side walls. In embodiments, the etch stop layer may be provided by a conformal deposition (e.g. ALD). The etch stop layer may protect the source/drain regions from damage (e.g. oxidation) during the removal of a material overlaying it. It is therefore typically sufficient for the etch stop layer to cover only the source/drain regions. Nevertheless lining the top surface of the etch stop layer may simultaneously also line the side walls of the spacers; this may be particularly true for SiN, where no technique is presently readily available to provide a layer which covers the top of the source/drain regions without also covering the side walls. In some embodiments, during the entire method, the etch stop layer may be exposed to only a single selective removal step. This may allow the etch stop layer to be relatively thin. In embodiments, the etch stop layer may have a thickness from 2 to 5 nm, e.g. 3 nm.

In embodiments, a top surface of the sacrificial material may be coplanar with the top surface of the gate plug. In embodiments, the sacrificial material may be a dielectric material (e.g. $SiO_2$). In embodiments, the sacrificial material may not be a carbon-containing dielectric material (e.g. a carbon-containing $SiO_2$). In embodiments, the other parts of the semiconductor structure may comprise further source/drain regions. In embodiments, the further source/drain regions may be dummy source/drain regions. Dummy source/drain regions may, for example, be source/drain regions which will not be functional in the final semiconductor device and which thus also do not need to be contacted. In embodiments, prior to step b, the dummy source/drain regions may be structurally similar (e.g. indistinguishable) from the source/drain regions (i.e. the source/drain regions which are to be contacted).

The masking structure masks part of the semiconductor structure, the part comprising the source region and the drain region on which respectively a source contact and a drain contact will be formed.

In embodiments, the masking structure may comprise a resist layer (e.g. a photoresist layer). Typically, the masking structure consists of a photoresist layer when the photoresist layer has just been deposited on the semiconductor structure and has just been patterned so as to mask the source region(s) and the drain region(s) to be contacted while leaving unmasked other parts of the semiconductor structure. In embodiments, the masking structure may further comprise a hardmask layer (e.g. TiN or spin-on-glass) and/or a softmask layer (e.g. spin-on-carbon) underlaying the resist layer. Typically, the patterned photoresist layer is formed on a hardmask layer, itself formed on a softmask layer. Once the pattern of the photoresist is transferred to the hardmask layer and the softmask layer, the masking structure consists of the photoresist layer, the hardmask layer and the softmask layer. In a particular embodiment, the masking structure may comprise a dielectric liner (e.g. $SiO_2$), a first hardmask layer (e.g. TiN) overlaying the dielectric liner, a softmask layer (e.g. spin-on-carbon) overlaying the first hardmask layer, a second hardmask layer (e.g. spin-on-glass) overlaying the softmask layer and a resist layer overlaying the second hardmask layer. In some embodiments, the softmask layer is formed on a first hardmask layer, itself formed on a dielectric liner. Once the pattern of the photoresist, the second hardmask layer and the softmask layer is transferred into the first hardmask layer and the dielectric liner, the masking structure may comprise the dielectric liner, the first hardmask layer, the softmask layer, the second hardmask layer and the resist layer. However, most typically, the resist layer, the second hardmask layer and the soft mask layer will not be present anymore after that the first hardmask layer and the dielectric liner have been patterned. Hence, in an embodiment, the masking structure consists in the patterned first hardmask layer on the patterned dielectric liner.

In embodiments, step b of selectively removing the sacrificial material present on the other parts of the semiconductor structure may be performed selectively with respect to the gate plug and the spacers. In embodiments, step b may further comprise removing the etch stop layer. As the selective removal in step b is limited to being performed above the other parts of the semiconductor structure (e.g. comprising dummy source/drain regions), the requirements for removal of the sacrificial material may be less stringent than in step f and g. For example, some over- or underetching of the dummy/source drain regions may be permissible. In embodiments, step b of selectively removing the sacrificial material present on the other parts of the semiconductor structure may comprise a dry etching. In some embodiments, the dry etching may be followed by a wet cleaning (e.g. a wet etching). The above notwithstanding, selective removal of the sacrificial material by dry etching only may be hard to control and can yield an undesired level of over- or underetching, particularly when the critical dimensions between the spacers are small. In some embodiments, the bulk of the sacrificial material may be removed with a dry etching and to subsequently remove any remaining sacrificial material and residue (e.g. resulting from the dry etching) with a wet cleaning.

In embodiments, step c may include a dry or wet etching. In embodiments, the dry or wet etching may be based on an ammonia hydroxide-hydrogen peroxide-water mixture (APM). In embodiments, step c may comprise removing the masking structure down to the dielectric liner. In other embodiments, step c may be performed together with step b.

In embodiments, the dielectric layer (e.g. an interlayer dielectric, ILD), deposited in step d, may comprise a carbon-containing oxide. In some embodiments, the carbon-containing oxide may be a carbon-containing $SiO_2$. The carbon-containing dielectric material may alternatively be referred to as a dense low-k material. In embodiments, the carbon-containing dielectric material may be deposited by spincoating or by a chemical vapor deposition. In embodiments, forming the carbon-containing dielectric material may comprise hydrolyzing an alkoxysilane.

In embodiments, step e may further comprise planarizing the dielectric layer. In embodiments, planarizing the dielectric layer may comprise recessing an overburden of the dielectric layer. In some embodiments, the overburden may be recessed down to the gate plug. Recessing the overburden down to the gate plug may play a role in controlling the etch selectivity in a subsequent step (e.g. step f and/or g). In embodiments, recessing the overburden down to the gate plug may expose the sacrificial material. In embodiments, planarizing the dielectric layer may comprise a chemical mechanical polishing.

In embodiments, step f may be performed selectively with respect to the gate plug, the spacers, the etch stop layer and the dielectric layer. In embodiments, step f may remove the sacrificial material down to the etch stop layer. In embodiments, step f may comprise an HF based wet etching.

In embodiments, step g may be performed selectively with respect to the gate plug, the spacers, the dielectric layer and the source and/or drain regions. In embodiments, step g may remove the etch stop layer down to the source and/or drain regions. In embodiments, step g may comprise a hot $H_3PO_4$ (e.g. 150° C. or more, such as 160° C.) or hot HF (e.g. 80 to 90° C.) based wet etching.

In embodiments, step f and/or g may comprise forming a gap above the at least one source and/or drain region. In embodiments, the gaps formed in step b and/or step g may have a width (w) from 10 to 20 nm, e.g., from 14 to 16 nm. In embodiments, a ratio between a depth (d) of the gaps and the width (w) dimension of the gaps may be at least 10:1, e.g., at least 15:1.

In embodiments, the conductive material may be selected from W, Co, and Ru. In embodiments, step h may comprise providing a contact lining prior to depositing the conductive material. In embodiments, the contact lining may comprise Ti or TiN. In embodiments, step h may comprise filling the gap formed in step g. In embodiments, the source contact and/or the drain contact may be a wrap-around contact. In embodiments, the source/drain contact may be electrically coupled to the source/drain region. In embodiments, the source/drain contact may make an electrical contact with the source/drain region, e.g., a direct mechanical contact.

In embodiments, the method may further comprise a step b', after step b and before step d, of:
b'. lining at least a lateral side of the gaps with a further etch stop layer.

In embodiments, the further etch stop layer may comprise a nitride material. The etch resistance, with respect to the wet etching in step f and/or step g, of the dielectric layer provided in step d is typically high in a top-down direction (e.g. the etch resistance of a top surface of the dielectric layer may be high). However, the etch resistance of this dielectric layer in a lateral direction may be lower. As such, the wet etching of step f and/or step g may cause some lateral overetch into the dielectric layer. This effect can be mitigated (e.g. prevented) by providing the further etch stop layer prior to step d (cf. example 2).

In a second aspect, the present disclosure relates to a semiconductor structure, comprising:
 i. a semiconductor active area comprising a channel region, a source region and a drain region, the source and drain regions having a top surface;
 ii. a gate structure on the channel region, the gate structure having a top surface and side walls;
 iii. a gate plug on the top surface of the gate structure, the gate plug having side walls;
 iv. spacers lining the side walls of the gate structure and of the gate plug;
 v. an etch stop layer covering at least the top surface of the source and drain regions;
 vi. a sacrificial material on the etch stop layer over the source and drain regions;
 vii. a dielectric layer covering other parts of the semiconductor structure while leaving the source region and the drain region uncovered;
wherein the material of the gate plug, the material of the spacers, the sacrificial material, the material of the etch stop layer, the material of the dielectric layer, and the material of the source and drain regions are selected in such a way:
 that the sacrificial material can be etched faster than the material of the gate plug, the material of the spacers, the material of the etch stop layer and the material of the dielectric layer during a wet etching process;
 that the etch stop layer can be entirely removed without entirely removing the gate plug, and
 that the material of the etch stop layer can be etched faster than the material of the spacers, the material of the dielectric layer, and the material of the source and drain regions during a wet etching process.

In embodiments, the condition that the etch stop layer can be entirely removed without entirely removing the gate plug can be satisfied by having a thickness for the etch stop layer smaller than a thickness for the gate plug, by having a material for the etch stop layer etching faster than a material for the gate plug, or by a combination of both.

In embodiments, any feature of the second aspect may independently be as correspondingly described for any embodiment of the first aspect.

The invention will now be described by a detailed description of several embodiments. It is clear that other embodiments can be configured without departing from the technical teaching of the disclosure, the invention being limited only by the terms of the appended claims.

Example 1: Forming Source/Drain Contacts in FinFET Formation

We now refer to FIG. 1. A semiconductor structure is provided, comprising a substrate (100) carrying semiconductor active areas (200) and gate structures (300). A semiconductor active area (200) consists of Si semiconductor fins (210) comprising a channel region (211) defined between epitaxially grown source/drain regions (221). The semiconductor fins (210) are isolated from each other by a $SiO_2$ shallow trench isolation layer (230; STI). A gate structure (300) comprises a high-k $HfO_2$ gate dielectric (310), a TiN work function metal (320) and a W gate contact (330). The gate structures (300) are typically oriented perpendicularly to the semiconductor fins (210). The gate structures (300) are capped by a 35 nm SiN gate plug (410). Low-k SiCO spacers (420) line the side walls of the gate structures (300) and gate plugs (410). A 3 nm SiN etch stop layer (430) covers at least the top surface of the source/drain regions (221) and typically also lines the side walls of the spacers (420). A SiO$_2$ sacrificial material (440) fills up gaps over the source/drain regions (221). A SiO$_2$ dielectric liner (510) and a TiN first hardmask layer (520) cover the entire structure.

Figure 2:
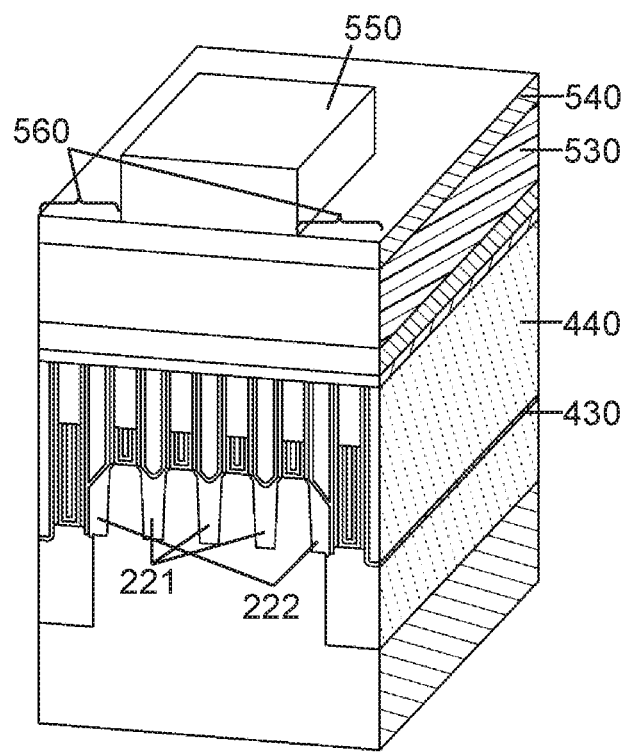
FIG. 2 is a schematic representation of a frontal perspective view of a semiconductor structure at a step of a method, according to example embodiments.

We now refer to FIG. 2. In this figure, the masking structure consists in the patterned resist (550). A spin-on-carbon planarization (e.g. a softmask) layer (530) and a spin-on-glass second hardmask layer (540) are formed over the first hardmask layer (520). A patterned resist (550) is subsequently provided over the second hardmask layer (540), masking certain source/drain regions (221) while leaving other parts (560) of the semiconductor structure unmasked. As such, the patterned resist (550) defines, on the one hand, those source/drain regions which will become contacted source/drain regions (221); these being the source/drain regions masked by the resist (550). On the other hand, the patterned resist (550) defines those source/drain regions which will act as dummy source/drain regions (216); these being the source/drain regions in the other parts (560) of the semiconductor structure.

Figure 3:
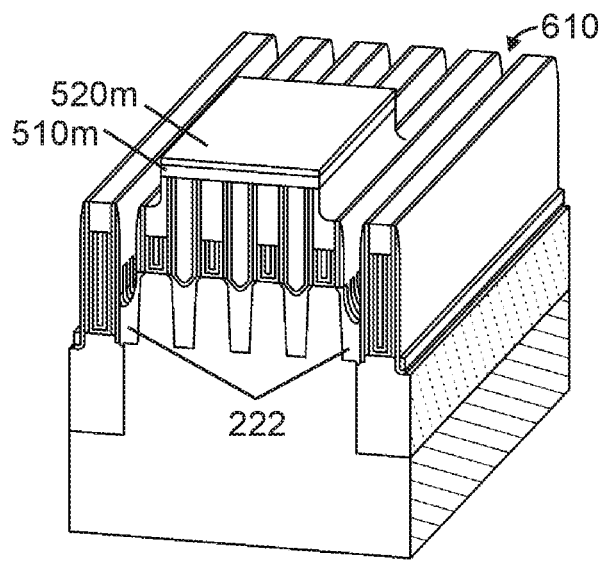
FIG. 3 is a schematic representation of a frontal perspective view of a semiconductor structure at a step of a method, according to example embodiments.

We now refer to FIG. 3. The pattern is selectively etched down up to the dummy source/drain regions (216), forming gaps (610) above the dummy source/drain regions (216). This is typically performed by a dry etch followed by a wet cleaning step; the sacrificial material (440) and etch stop layer (430) above the dummy source/drain regions (216) are thereby removed. Since these dummy source/drain regions (216) will not be used as functional contacted source/drain regions (221) in the final device, the etching requirements (e.g. etch selectivity and limitation of overetching) in this step can be somewhat less stringent (e.g. compared to the etching performed in FIGS. 7 and 8 below).

Figure 4:
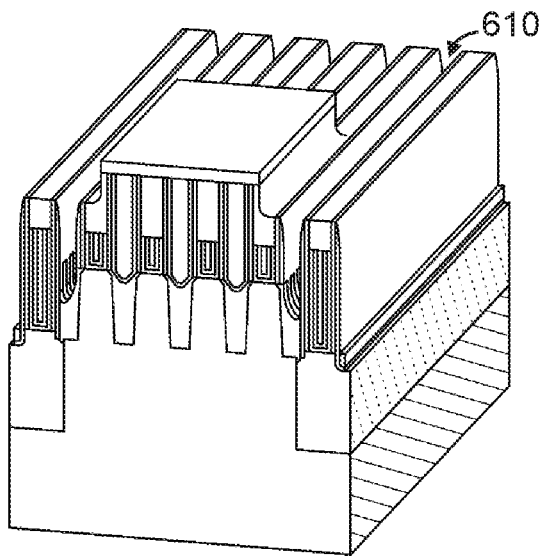
FIG. 4 is a schematic representation of a frontal perspective view of a semiconductor structure at a step of a method, according to example embodiments.

We now refer to FIG. 4. The remainder of the first hardmask layer (520) is removed by a dry or wet etching based on an ammonia hydroxide-hydrogen peroxide-water mixture (APM).

Figure 5:
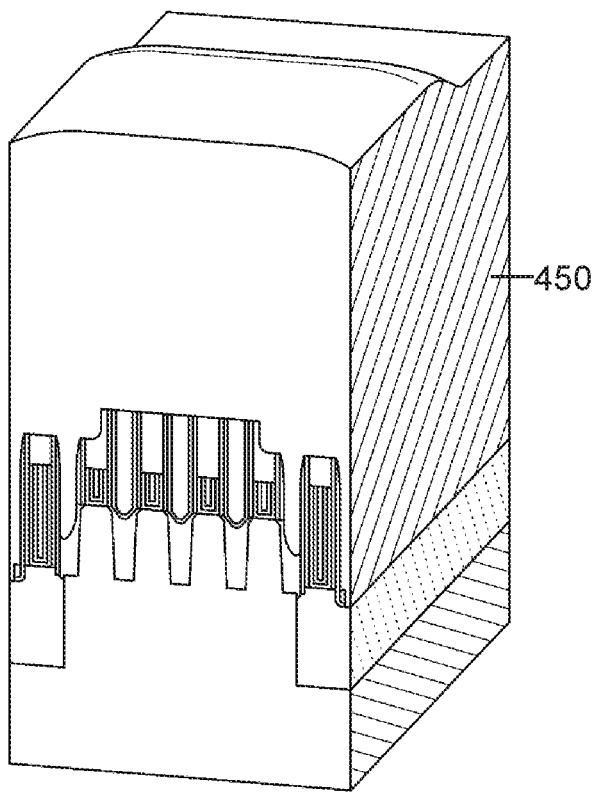
FIG. 5 is a schematic representation of a frontal perspective view of a semiconductor structure at a step of a method, according to example embodiments.

We now refer to FIG. 5. The gaps (610) above the source/drain regions (221) are overfilled with a carbon-containing SiO$_2$ dielectric layer (450).

Figure 6:
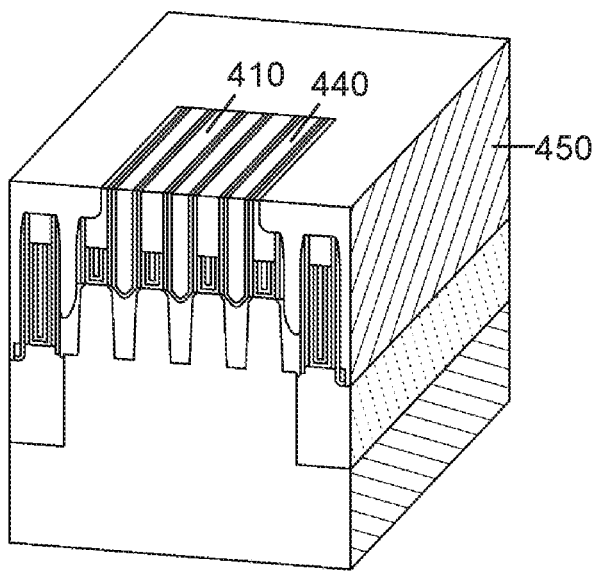
FIG. 6 is a schematic representation of a frontal perspective view of a semiconductor structure at a step of a method, according to example embodiments.

We now refer to FIG. 6. The overburden of the carbon-containing dielectric layer (450) is recessed back to the gate plug (410) by a chemical mechanical polishing (CMP). The sacrificial material (440) above the to-be-contacted source/drain regions (221) is thereby exposed.

Figure 7A:
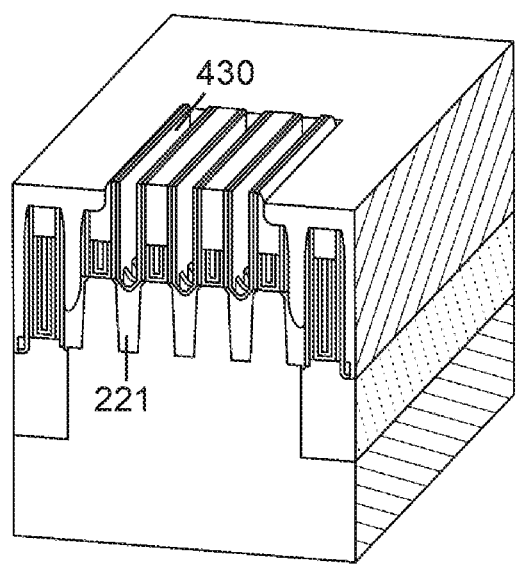
FIG. 7A is a schematic representation of a frontal perspective view of a semiconductor structure at a step of a method, according to example embodiments.
Figure 7B:
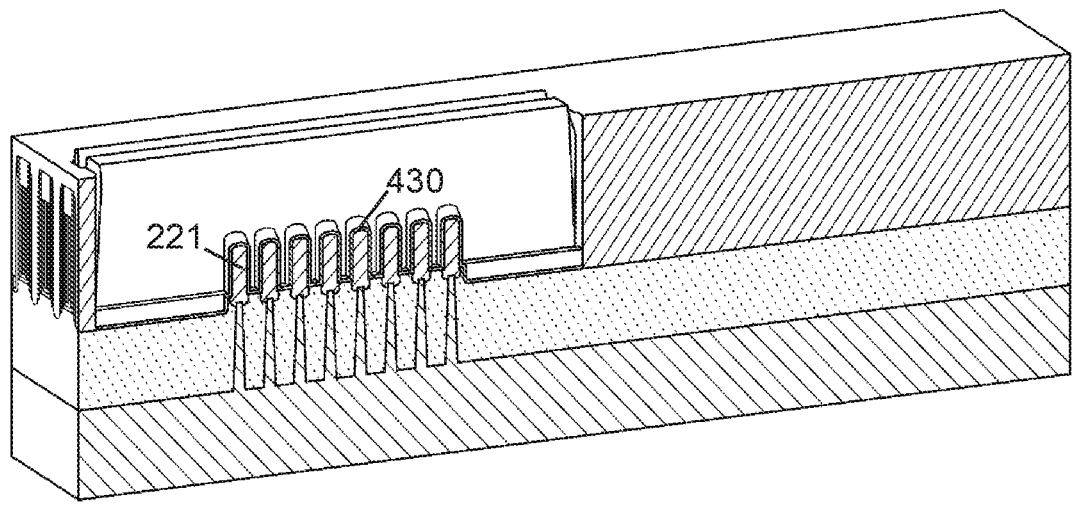
FIG. 7B is a schematic representation of a sideways perspective view of a semiconductor structure at a step of a method, according to example embodiments.

We now refer to FIG. 7, showing both a front view (a) and a side view (b) of the semiconductor structure. The sacrificial material (440) above the to-be-contacted source/drain regions (221) is selectively removed by an HF based wet etching at room temperature, stopping on the etch stop layer (430); thereby forming gaps (620) overlaying the to-be-contacted source/drain regions (221).

Figure 8A:
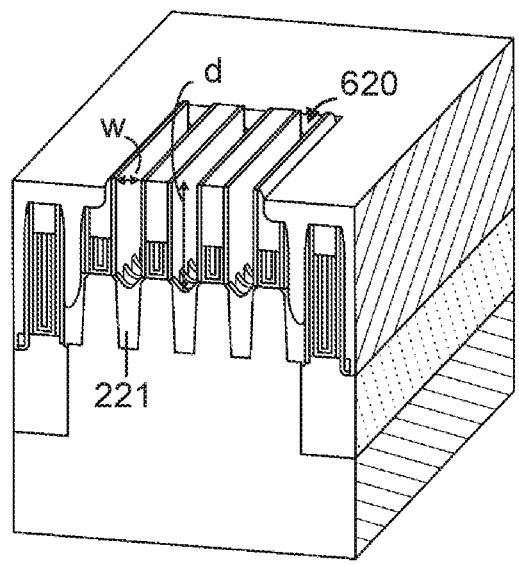
FIG. 8A is a schematic representation of a frontal perspective view of a semiconductor structure at a step of a method, according to example embodiments.
Figure 8B:
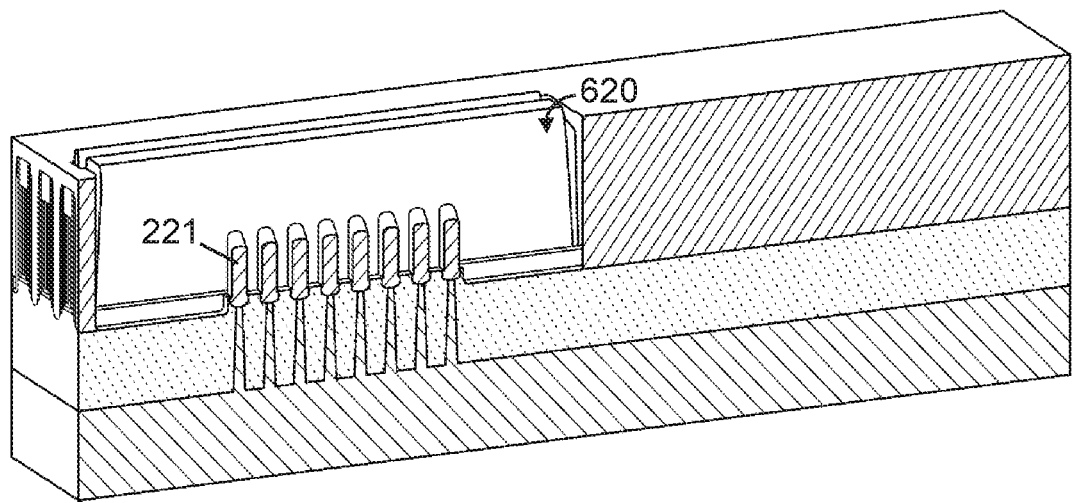
FIG. 8B is a schematic representation of a sideways perspective view of a semiconductor structure at a step of a method, according to example embodiments.

We now refer to FIG. 8, showing both a front view (a) and a side view (b) of the semiconductor structure. The etch stop layer (430) is selectively removed by a hot (e.g. 160° C.) H$_3$PO$_4$ or hot (e.g. 80 to 90° C.) HF based wet etching; thereby exposing the to-be-contacted source/drain regions (221).

Figure 9A:
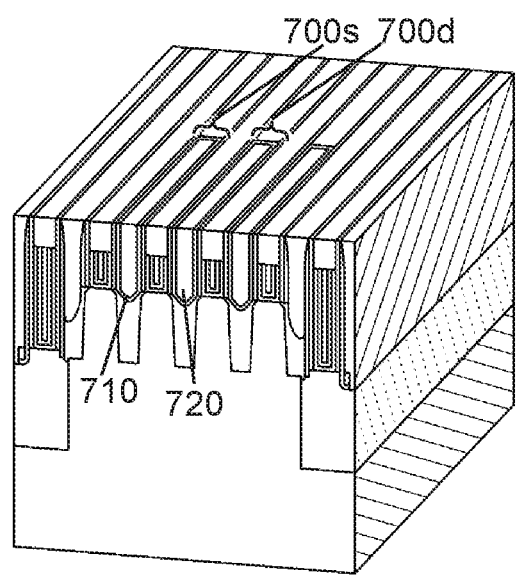
FIG. 9A is a schematic representation of a frontal perspective view of a semiconductor structure at a step of a method, according to example embodiments.
Figure 9B:
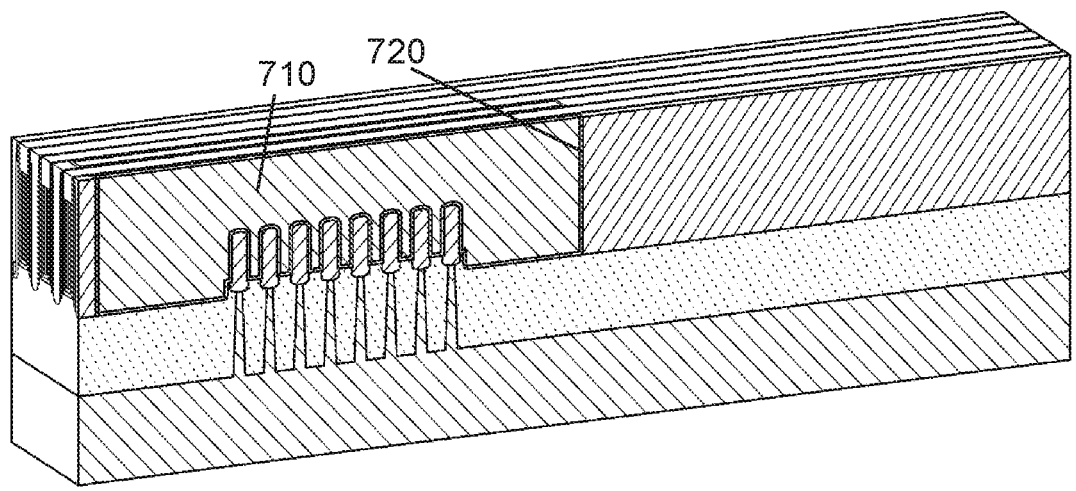
FIG. 9B is a schematic representation of a sideways perspective view of a semiconductor structure at a step of a method, according to example embodiments.

We now refer to FIG. 9, showing both a front view (a) and a side view (b) of the semiconductor structure. The source/drain contacts (700) are formed by lining the gaps (620) above the to-be-contacted source/drain regions (221) with a Ti contact lining (710) and filling the gaps (620) with W conductive material (720; e.g. a contact metal), for example using a damascene process. The architecture shown in this example is such that the source/drain contacts (700) that are formed are wrap-around contacts (WAC).

Subsequently (not shown), a further metallization layer may be provided over the source/drain contacts (700).

Example 2: Formation of Source/Drain Contacts in FinFET Formation Using an Additional Etch Stop Lining The procedure outlined in example 1 for FIGS. 1-4 is repeated.

Figure 10A:
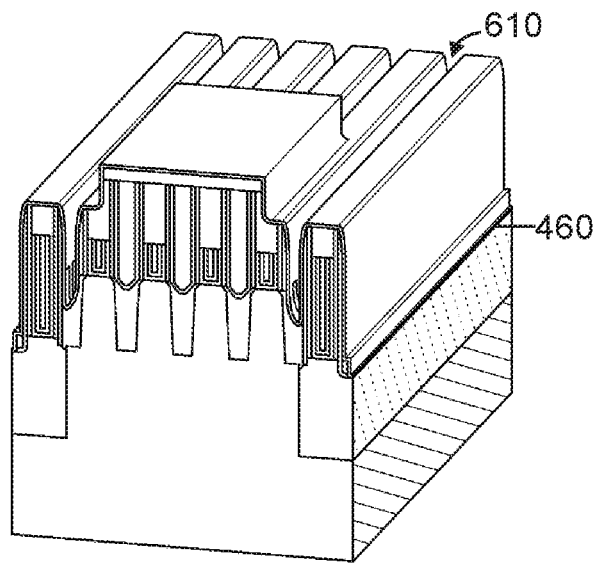
FIG. 10A is a schematic representation of a frontal perspective view of a semiconductor structure at a step of a method, according to example embodiments.
Figure 10B:
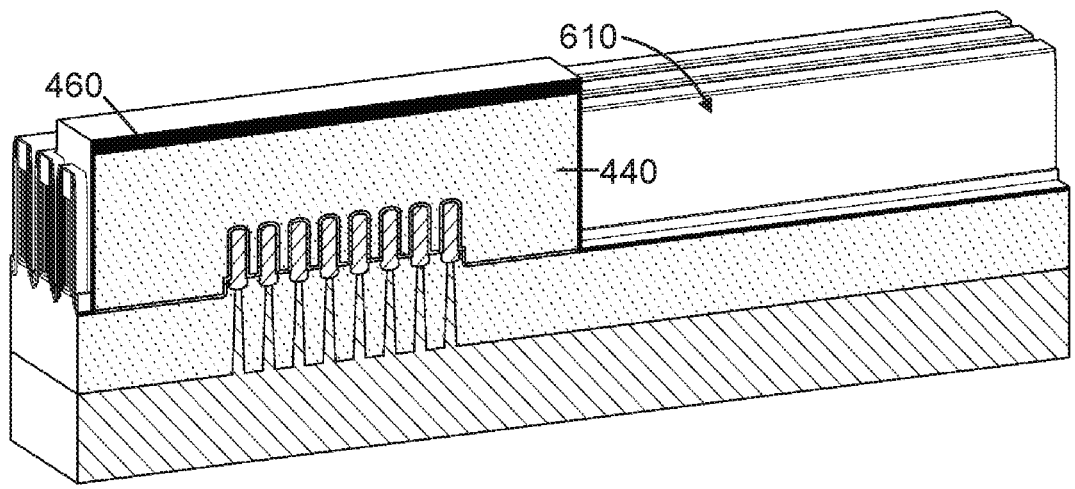
FIG. 10B is a schematic representation of a sideways perspective view of a semiconductor structure at a step of a method, according to example embodiments.

We now refer to FIG. 10, showing both a front view (a) and a side view (b) of the semiconductor structure. The entire structure in overlayed with a thin SiCO etch stop layer (460), lining among others the side walls of the masked sacrificial material (440).

Figure 11:
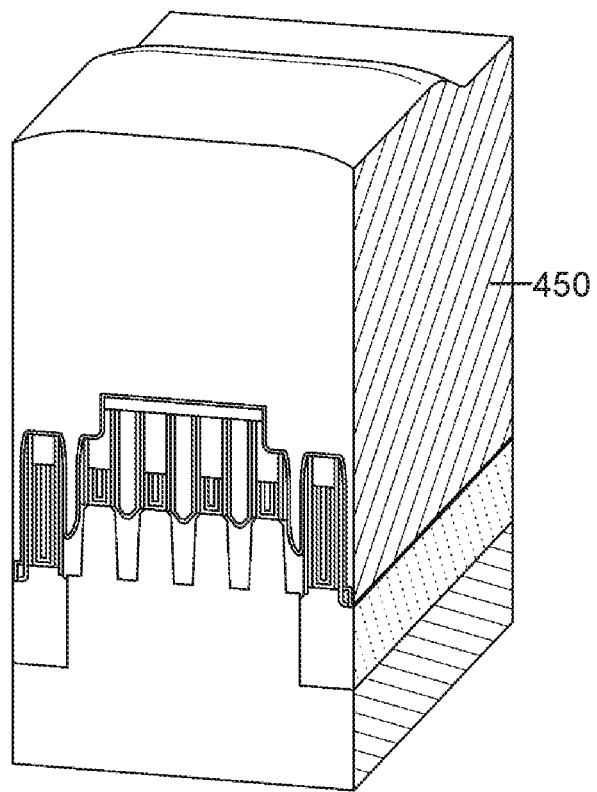
FIG. 11 is a schematic representation of a frontal perspective view of a semiconductor structure at a step of a method, according to example embodiments.

We now refer to FIG. 11. The gaps (610) above the source/drain regions (221) are overfilled with a carbon-containing SiO$_2$ dielectric layer (450).

Figure 12:
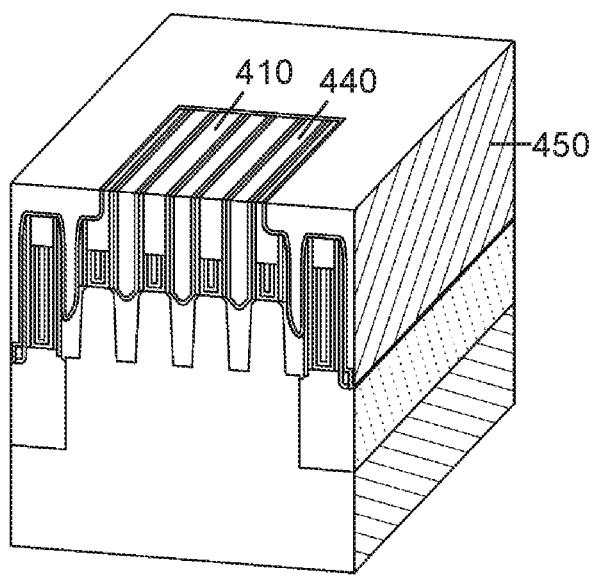
FIG. 12 is a schematic representation of a frontal perspective view of a semiconductor structure at a step of a method, according to example embodiments.

We now refer to FIG. 12. The overburden of the carbon-containing dielectric layer (450) is recessed back to the gate plug (410) by a chemical mechanical polishing (CMP). The sacrificial material (440) above the to-be-contacted source/drain regions (221) is thereby exposed.

Figure 13A:
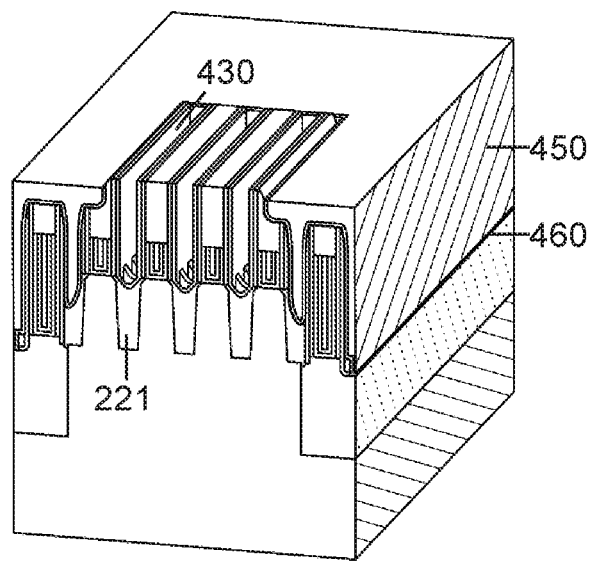
FIG. 13A is a schematic representation of a frontal perspective view of a semiconductor structure at a step of a method, according to example embodiments.
Figure 13B:
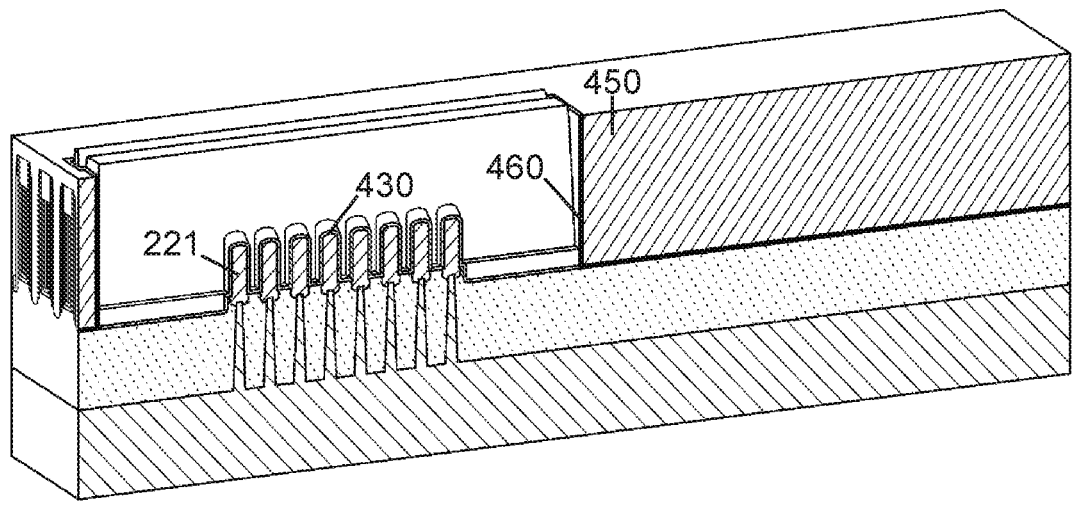
FIG. 13B is a schematic representation of a sideways perspective view of a semiconductor structure at a step of a method, according to example embodiments.

We now refer to FIG. 13, showing both a front view (a) and a side view (b) of the semiconductor structure. The sacrificial material (440) above the to-be-contacted source/drain regions (221) is selectively removed by an HF based wet etching at room temperature, stopping on the etch stop layer (430); thereby forming gaps (620) overlaying the to-be-contacted source/drain regions (221). During this selective removal, the etch stop layer (460) further protects the carbon-containing SiO$_2$ dielectric layer (450).

The further procedure is as further outlined in example 1 from FIG. 8 onwards.

It is to be understood that although example embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

What is claimed is:
1. A method for forming a source contact and a drain contact in a semiconductor structure, comprising:
   providing a semiconductor structure comprising:
      a semiconductor active area comprising a channel region, a source region, and a drain region, wherein the source region and the drain region each has a top surface;
      a gate structure on the channel region, wherein the gate structure has a top surface and side walls;
      a gate plug on the top surface of the gate structure, wherein the gate plug has side walls;
      spacers lining the side walls of the gate structure and the side walls of the gate plug;
      an etch stop layer covering the top surface of the source region and the top surface of the drain region;

a sacrificial material on the etch stop layer over the source region and the drain region and other parts of the semiconductor structure; and a masking structure masking the source region and the drain region while leaving the other parts of the semiconductor structure unmasked;

forming gaps by selectively removing the sacrificial material present on the other parts of the semiconductor structure;

removing all or part of the masking structure;

filling the gaps by depositing a dielectric layer on the semiconductor structure;

exposing the sacrificial material present on the etch stop layer over the source region and the drain region;

selectively removing, by a wet etching process, the sacrificial material present on the etch stop layer over the source region and the drain region;

selectively removing, by a wet etching process, the etch stop layer covering the top surface of the source region and the top surface of the drain region to such an extent as to expose the top surface of the source region and the top surface of the drain region;

forming the source contact and the drain contact in the semiconductor structure by depositing a conductive material on the source region and the drain region, wherein a material of the gate plug, a material of the spacers, the sacrificial material, a material of the etch stop layer, a material of the dielectric layer, and a material of the source region and the drain region are selected such that:

the sacrificial material etches faster than the material of the gate plug, the material of the spacers, the material of the etch stop layer, and the material of the dielectric layer during the selective removal of the sacrificial material present on the etch stop layer;

the etch stop layer is entirely removable without entirely removing the gate plug; and the material of the etch stop layer etches faster than the material of the spacers, the material of the dielectric layer, and the material of the source region and the drain region during the selective removal of the etch stop layer covering the top surface of the source region and the top surface of the drain region.

2. The method according to claim 1, wherein the sacrificial material comprises a dielectric material.

3. The method according to claim 1, wherein forming gaps by selectively removing the sacrificial material present on the other parts of the semiconductor structure is performed selectively with respect to the gate plug and the spacers.

4. The method according to claim 1, wherein forming gaps by selectively removing the sacrificial material present on the other parts of the semiconductor structure comprises a dry etching.

5. The method according to claim 1, wherein the gate plug comprises a nitride material or an oxycarbide material.

6. The method according to claim 1, wherein the spacers comprise a low-k material.

7. The method according to claim 1, wherein the etch stop layer comprises a nitride material.

8. The method according to claim 1, wherein the dielectric layer, deposited during the deposition of the dielectric layer on the semiconductor structure, comprises a carbon-containing oxide.

9. The method according to claim 1, wherein the source contact or the drain contact is a wrap-around contact.

10. The method according to claim 1, further comprising lining at least a lateral side of the gaps with a further etch stop layer.

11. The method according to claim 10, wherein the further etch stop layer comprises a nitride material.

12. The method according to claim 1, wherein the removal of all or part of the masking structure is performed together with the selective removal of the sacrificial material present on the other parts of the semiconductor structure.

13. The method according to claim 1, wherein exposing the sacrificial material present on the etch stop layer over the source region and the drain region comprises planarizing the dielectric layer.

14. The method according to claim 1, wherein the semiconductor active area comprises a semiconductor fin.

15. A semiconductor structure, comprising:

a semiconductor active area comprising a channel region, a source region, and a drain region, wherein the source region and the drain region each has a top surface;

a gate structure on the channel region, wherein the gate structure has a top surface and side walls;

a gate plug on the top surface of the gate structure, wherein the gate plug has side walls;

spacers lining the side walls of the gate structure and the side walls of the gate plug;

an etch stop layer covering the top surface of the source region and the top surface of the drain region;

a sacrificial material on the etch stop layer over the source region and the drain region;

a dielectric layer covering other parts of the semiconductor structure while leaving the source region and the drain region uncovered, wherein a material of the gate plug, a material of the spacers, the sacrificial material, a material of the etch stop layer, a material of the dielectric layer, and a material of the source region and the drain region are selected such that:

the sacrificial material can be etched faster than the material of the gate plug, the material of the spacers, the material of the etch stop layer, and the material of the dielectric layer during a wet etching process;

the etch stop layer is entirely removable without entirely removing the gate plug; and the material of the etch stop layer can be etched faster than the material of the spacers, the material of the dielectric layer, and the material of the source region and the drain region during a wet etching process.

16. The semiconductor structure according to claim 15, wherein the sacrificial material comprises a dielectric material.

17. The semiconductor structure according to claim 15, wherein the gate plug comprises a nitride material or an oxycarbide material.

18. The semiconductor structure according to claim 15, wherein the etch stop layer comprises a nitride material.

19. The semiconductor structure according to claim 15, wherein the dielectric layer comprises a carbon-containing oxide.

20. The semiconductor structure according to claim 15, wherein the spacers comprise a low-k material.

* * * * *